(12) United States Patent
Behrends et al.

(10) Patent No.: US 7,724,585 B2
(45) Date of Patent: May 25, 2010

(54) IMPLEMENTING LOCAL EVALUATION OF DOMINO READ SRAM WITH ENHANCED SRAM CELL STABILITY

(75) Inventors: Derick Gardner Behrends, Rochester, MN (US); Travis Reynold Hebig, Rochester, MN (US); Daniel Mark Nelson, Rochester, MN (US); Jesse Daniel Smith, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 12/195,117

(22) Filed: Aug. 20, 2008

(65) Prior Publication Data

US 2010/0046277 A1    Feb. 25, 2010

(51) Int. Cl.
*G11C 7/06* (2006.01)
*G06F 17/50* (2006.01)

(52) U.S. Cl. .............. 365/189.14; 365/189.15; 365/189.16; 365/189.06; 365/190; 365/203; 365/156; 716/12; 716/17

(58) Field of Classification Search ............. 365/156, 365/154, 190, 205, 208, 189.14, 189.15, 365/189.16, 189.17, 189.06, 203; 716/12, 716/13, 14, 17
See application file for complete search history.

(56) References Cited

U.S. PATENT DOCUMENTS

| | | | | |
|---|---|---|---|---|
| 5,696,724 A | * | 12/1997 | Koh et al. | 365/205 |
| 6,081,465 A | * | 6/2000 | Wang et al. | 365/201 |
| 6,735,136 B2 | * | 5/2004 | Lee | 365/206 |
| 7,289,370 B2 | | 10/2007 | Adams et al. | |
| 7,414,878 B1 | | 8/2008 | Christensen et al. | |
| 7,502,276 B1 | * | 3/2009 | Behrends et al. | 365/230.02 |

* cited by examiner

*Primary Examiner*—Andrew Q Tran
(74) *Attorney, Agent, or Firm*—Joan Pennington

(57) ABSTRACT

A method and circuit for implementing domino static random access memory (SRAM) local evaluation with enhanced SRAM cell stability, and a design structure on which the subject circuit resides are provided. A SRAM local evaluation circuit enabling a read and write operations of an associated SRAM cell group includes true and complement bitlines, a single write data propagation input, a precharge signal, and a precharge write signal. A passgate device is connected between the complement bitline and the write data propagation input. A transistor stack is connected in series with the precharge device between the true bitline and ground. The precharge write signal disables the passgate device connected between the complement bitline and the write data propagation input during a read operation. During write operations, the precharge write signal enables the passgate device connected between the complement bitline and the write data propagation input and activates the transistor stack.

18 Claims, 7 Drawing Sheets

IMPLEMENTING LOCAL EVALUATION OF DOMINO READ SRAM WITH ENHANCED SRAM CELL STABILITY

FIELD OF THE INVENTION

The present invention relates generally to the data processing field, and more particularly, relates to a method and circuit for implementing local evaluation of Domino read SRAM with enhanced SRAM cell stability, and a design structure on which the subject circuit resides.

RELATED APPLICATION

A related United States patent application assigned to the present assignee is being filed on the same day as the present patent application as follows:

United States patent application Ser. No. 12/195,151, by Chad Allen Adams et al., and entitled "IMPLEMENTING LOCAL EVALUATION OF DOMINO READ SRAM WITH ENHANCED SRAM CELL STABILITY WITH MINIMIZED AREA USAGE."

DESCRIPTION OF THE RELATED ART

High performance SRAMs often use domino read structures to achieve more aggressive performance targets. The major part of this design is the local evaluation circuit. The local evaluation circuit enables read and write functions.

U.S. Pat. No. 7,414,878 issued Aug. 19, 2008, U.S. patent application Ser. No. 11/744,288 filed May 4, 2007 by Todd Alan Christensen et al., and assigned to the present assignee, discloses a method and apparatus implementing domino static random access memory (SRAM) leakage current reduction including a local evaluation circuit coupled to true and complement bit lines of a pair of local SRAM cell groups receiving precharge signals and provides an output connected to a global dot line. A sleep input is applied to SRAM sleep logic and a write driver including sleep control. Data true and data complement outputs of the write driver are forced to a respective selected level to discharge the bit lines and global dot lines when the sleep input transitions high. Discharging the bit lines and global dot lines is implemented through gating in the write driver without requiring any additional devices in the local evaluation circuit.

U.S. Pat. No. 7,289,370 issued Oct. 30, 2007 by Chad Allen Adams et al., and assigned to the present assignee, discloses a method for accessing memory including the steps of (1) storing a bit in a cell included in a memory having a plurality of cells arranged into rows and columns, wherein each cell includes a group of transistors adapted to both store the bit and affect a signal asserted during a read operation on a bit line coupled to the cell such that the affected signal matches a value of the bit stored in the cell; and (2) preventing the value of the bit stored in the cell from changing state while the group of transistors affects the signal asserted during the read operation on the bit line coupled to the cell.

FIGS. 1 and 2 respectively illustrate a prior art local evaluation circuit 100 typically connected to one column of SRAM cells connected to bitlines BLT0 and BLC0 and another column of SRAM cells connected to bitlines BLT1 and BLC1 and a conventional six-transistor static random access memory (SRAM) cell 200.

Referring now to FIG. 1, the prior art local evaluation circuit 100 includes a write and restore function generally designated by 110 coupled to bitlines BLT1, BLC1, and a write and restore function generally designated by 112 coupled to bitlines BLT0, BLC0. The BLT1, BLC1 write and restore function 110 includes a first transistor stack connected between a voltage supply VDD and ground including a PFET 114 connected in series with a pair of series connected NFETs 116, 118. A series connected PFET 120 and NFET 122 is connected between bitline BLC1 and input WT_B. A PFET 124 is connected between voltage supply VDD and bitline BLT1. A respective gate of PFET 114 and NFET 116, and PFET 120 and NFET 122 is connected to a first precharge signal PCHG1. The common drain connection of PFET 114 and NFET 116 is connected to bitline BLT1. The gate of PFET 124 is connected to input WT_B. The gate of NFET 118 is connected to input WC.

The BLT0, BLC0 write and restore function 112 includes a first transistor stack connected between a voltage supply VDD and ground including a PFET 134 connected in series with a pair of series connected NFETs 136, 138. A series connected PFET 140 and NFET 142 is connected between bitline BLC0 and WT_B input. A PFET 144 is connected between voltage supply VDD and bitline BLT0. A respective gate of PFET 134 and NFET 136, and PFET 140 and NFET 142 is connected to a first precharge signal PCHG0. The common drain connection of PFET 134 and NFET 136 is connected to bitline BLT0. The gate of PFET 144 is connected to input WT_B. The gate of NFET 138 is connected to input WC.

The local evaluation circuit 100 includes read devices of a two-input NAND gate defined by PFETs 146, 148 and NFETs 150, 152 coupled to the bitlines BLT0, BLT1 and an NFET 154 connected between the global dot line DOT and ground. The output of NAND gate is applied to the gate of NFET 154 driving the global dot line DOT.

FIG. 2 illustrates the SRAM cell 200 including a six-transistor cell with four transistors 202, 204, 206, and 208 configured as a cross-coupled latch for storing data. A pair of transistors 210, 212 is used to obtain access to the memory cell. A wordline input WL provides a gate input to the N-channel field effect transistor (NFETs) 210, 212. A particular wordline input WL is activated, turning on respective NFETs to perform a read or write operation.

Referring also to FIG. 3, there is shown a timing diagram illustrating the operation of the prior art SRAM local evaluation circuit 100. The precharge signals PCHG0 or PCHG1 in the local evaluation circuit 100 of FIG. 1 are decoded such that one of the precharge signals or neither of the precharge signals is high. Notice that when reading a one '1' with the TRU node of cell being read is a one '1' and CMP is zero '0', the PRECHARGE, WL, and WT_B are high. This causes a weak clamp, or fighting condition between the CMP node which is at zero '0' and the BLC node, which is at the voltage supply VDD minus the voltage threshold $VT_N$ of NFET 212 or $VDD-VT_N$.

This weak clamp condition has the undesired affect of making the cell very susceptible to changing state during this read. Given the millions of cells that can exist on a chip and the large VT scatter numbers this issue can cause low yields. This can be remedied by tuning the cell devices' voltage threshold VT's such that the cell is more stable, but doing this makes the cell less writable.

As shown, the prior art local evaluation circuit 100 of FIG. 1 requires two wires WC, WT_B for write data propagation, which limits porosity of predefined metal layers M2/M4. In current designs, this metal direction of the predefined metal layers M2/M4 is the most heavily used.

A need exists for effectively implementing local evaluation of domino read SRAM and that provides enhanced SRAM cell stability.

SUMMARY OF THE INVENTION

Principal aspects of the present invention are to provide a method and circuit for implementing domino static random access memory (SRAM) cell local evaluation with enhanced SRAM cell stability, and a design structure on which the subject circuit resides. Other important aspects of the present invention are to provide such method and circuit for implementing domino static random access memory (SRAM) cell local evaluation with enhanced SRAM cell stability substantially without negative effect and that overcome many of the disadvantages of prior art arrangements.

In brief, a method and circuit for implementing domino static random access memory (SRAM) local evaluation with enhanced SRAM cell stability, and a design structure on which the subject circuit resides are provided. A SRAM local evaluation circuit enabling a read and write operations of an associated SRAM cell group includes true and complement bitlines, a single write data propagation input, a precharge signal, and a precharge write signal. A respective precharge device is connected between a voltage supply VDD and the true bitline and the complement bitline. A passgate device is connected between the complement bitline and the write data propagation input. A transistor stack is connected in series with the precharge device between the true bitline and ground. The precharge write signal disables the passgate device connected between the complement bitline and the write data propagation input during a read operation. During write operations, the precharge write signal enables the passgate device connected between the complement bitline and the write data propagation input and activates the transistor stack.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
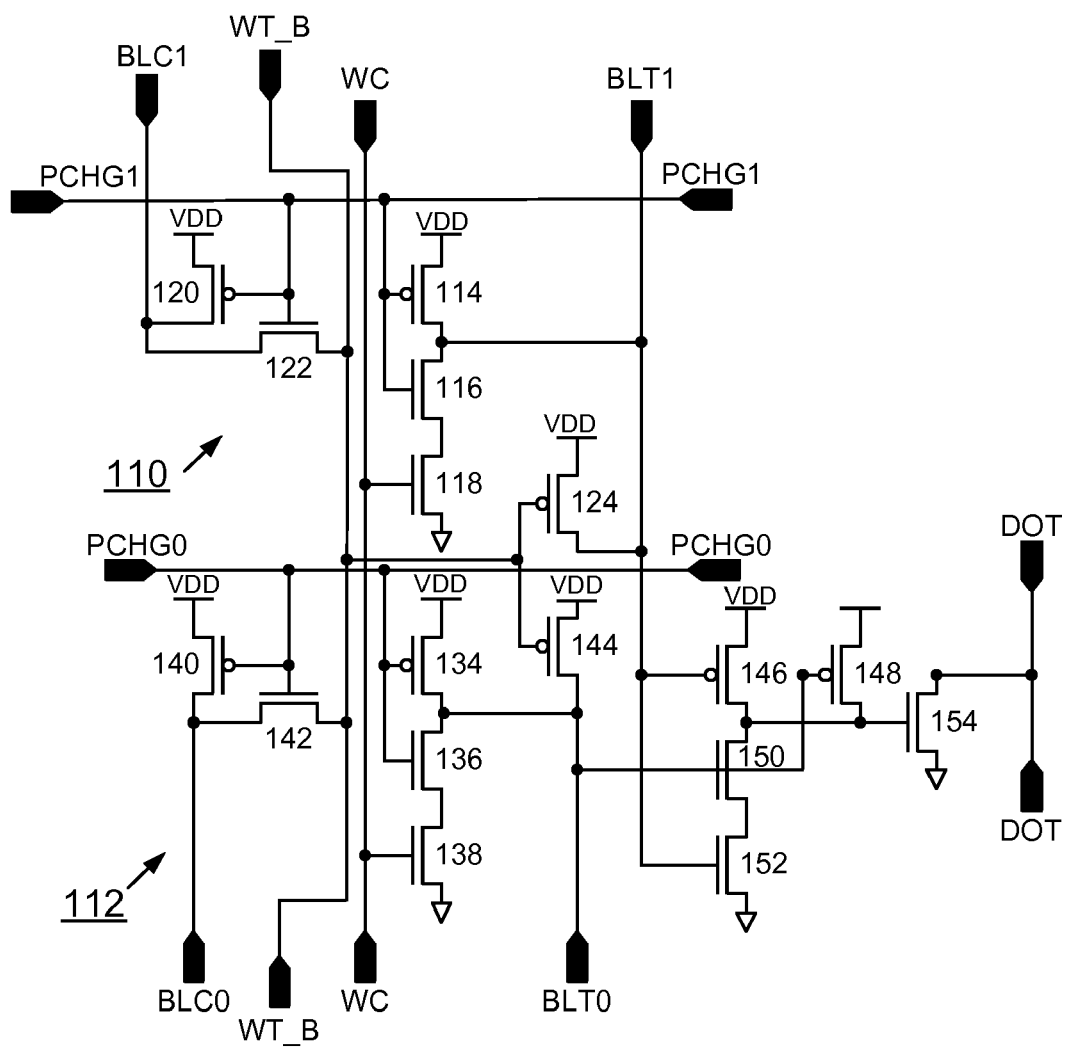
FIG. 1 is a schematic diagram of a prior art static random access memory (SRAM) local evaluation circuit

In accordance with features of the invention, a local evaluation circuit is provided for domino read SRAM, enabling enhanced SRAM cell stability by eliminating some problems with the prior art local evaluation circuit 100 of FIG. 1.

The prior art local evaluation circuit 100 of FIG. 1 requires two wires WC, WT_B for write data propagation, which limits porosity of predefined metal layers M2/M4. In current designs, this metal direction of the predefined metal layers M2/M4 is the most heavily used.

In accordance with features of the invention, the SRAM local evaluation circuit enables enhanced SRAM cell stability and only requires one vertical data wire for write data propagation thus improving porosity of the predefined metal layers M2/M4.

Figure 4:
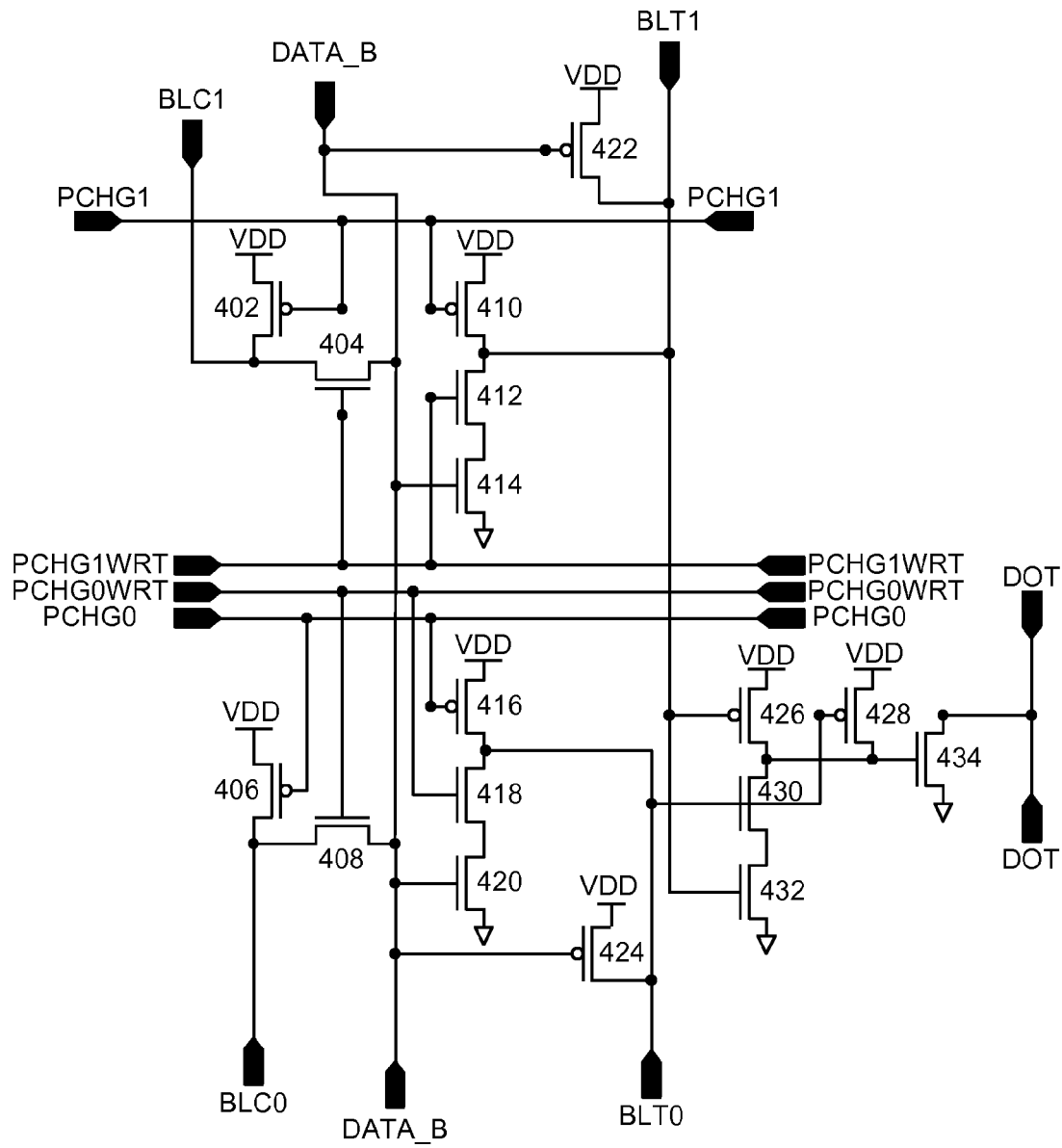
FIG. 4 is a schematic diagram of a static random access memory (SRAM) local evaluation circuit in accordance with the preferred embodiment.

Having reference now to the drawings, in FIG. 4, there is shown a static random access memory (SRAM) local evaluation circuit generally designated by the reference character 400 in accordance with the preferred embodiment.

Figure 2:
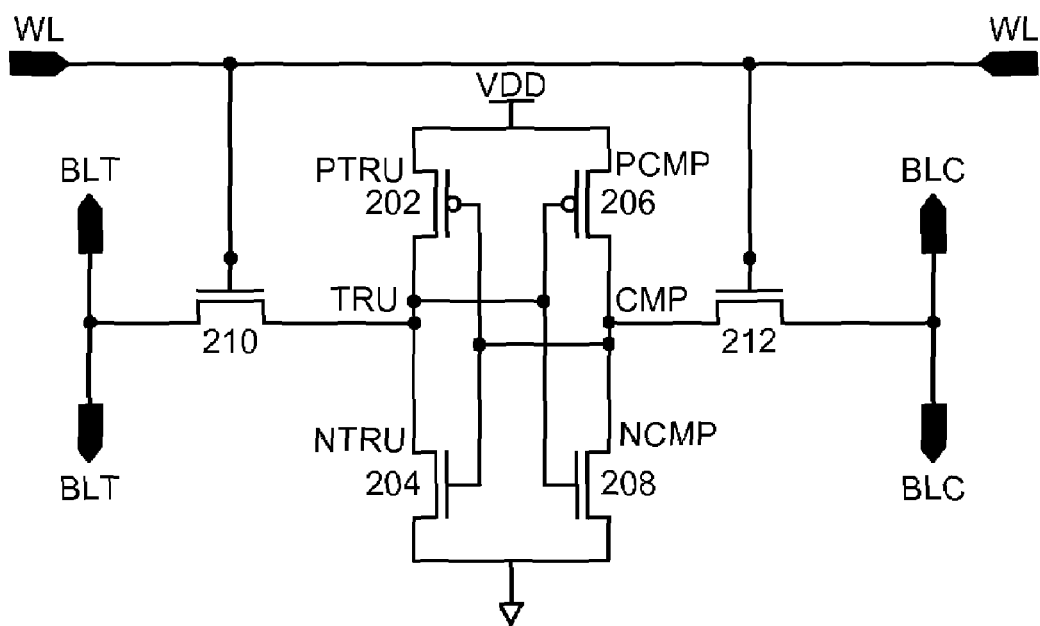
FIG. 2 is a schematic diagram of a prior art six-transistor static random access memory (SRAM) cell.
Figure 3:
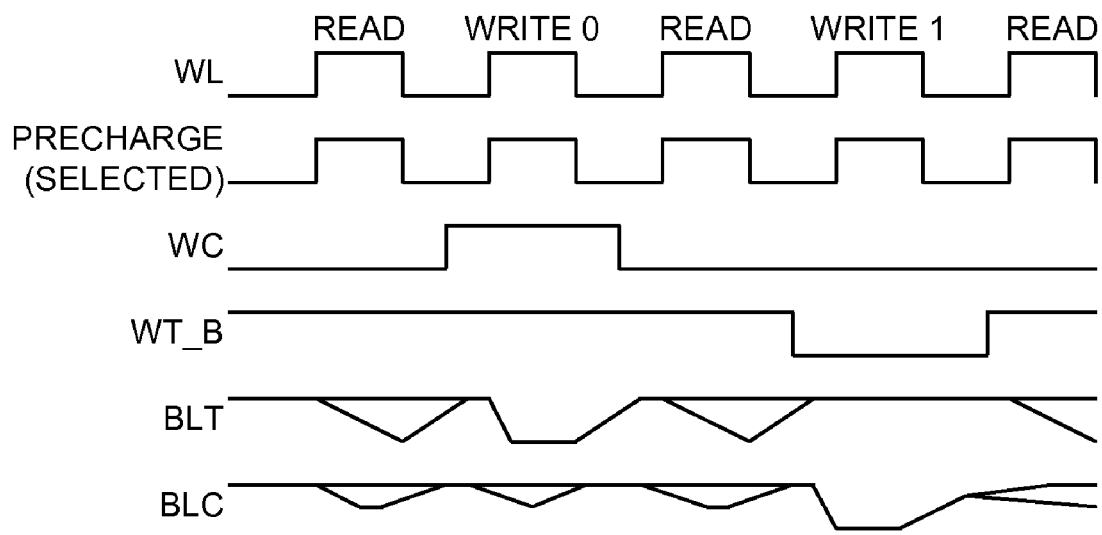
FIG. 3 is a timing diagram illustrating the operation of the prior art SRAM local evaluation circuit of FIG. 1.

SRAM local evaluation circuit 400 includes a lower or bottom bitline pair or bitlines BLT0 and BLC0 connected to one column of SRAM cells and an upper or top bitline pair or bitlines BLT1 and BLC1 connected to another column of SRAM cells. The columns of SRAM cells are at least one SRAM cell 200 or groups of cells, such as sixteen cells per column of the conventional six-transistor static random access memory (SRAM) cells 200 shown in FIG. 2.

SRAM local evaluation circuit 400 includes a lower or bottom precharge PCHG0, and an upper or top precharge PCHG1, and in accordance with the preferred embodiment also includes a lower or bottom precharge PCHGWRT0, and an upper or top precharge PCHGWRT1. SRAM local evaluation circuit 400 requires only a single wire for a write data propagation signal DATA_B for write data propagation.

In accordance with features of the invention, the lower or bottom precharge write PCHGWRT0, and the upper or top precharge write PCHGWRT1 of the SRAM local evaluation circuit 400 are provided to disable the write circuits during a read operation. During a read operation, the respective lower or bottom precharge PCHGWRT0, and the upper or top precharge PCHGWRT1 disable the passgate between DATA_B and the respective bitline BLC when the SRAM cell is TRU='1'/CMP='0', so that the weak clamp issue does not exist with the SRAM local evaluation circuit 400.

SRAM local evaluation circuit 400 includes an upper precharge device, P-channel field effect transistor 402 connected between a voltage supply VDD and the complement bitline BLC and a passgate device N-channel field effect transistor 404 connected between the complement bitline BLC and the write data propagation input DATA_B. The upper or top precharge PCHG1 is applied to a gate of the precharge PFET 402, and the upper or top precharge PCHGWRT1 is applied to a gate of the passgate NFET 404

SRAM local evaluation circuit 400 includes a lower precharge device, P-channel field effect transistor 406 connected between a voltage supply VDD and the complement bitline BLC0 and a passgate device N-channel field effect transistor 408 connected between the complement bitline BLC0 and the write data propagation input DATA_B. The lower precharge PCHG0 is applied to a gate of the precharge PFET 406, and the lower precharge PCHGWRT0 is applied to a gate of the passgate NFET 408.

SRAM local evaluation circuit 400 includes an upper first transistor stack connected between a voltage supply VDD and ground including a PFET 410 connected in series with a pair of series connected NFETs 412, 414, and a lower second transistor stack connected between a voltage supply VDD and ground including a PFET 416 connected in series with a pair of series connected NFETs 418, 420. The upper or top precharge PCHG1 is applied to a gate of the precharge PFET 410 and the lower precharge PCHG0 is applied to a gate of the precharge PFET 416. The gate of NFETs 414, 420 is the write data input DATA_B. The upper or top precharge write PCHGWRT1 is applied to a gate of the NFET 412 and the lower precharge write PCHGWRT0 is applied to a gate of the NFET 418.

SRAM local evaluation circuit 400 includes a PFET 422 connected between the voltage supply VDD and bitline BLT1 with the write date input DATA_B applied to the gate of PFET 422. SRAM local evaluation circuit 400 includes a PFET 424 connected between the voltage supply VDD and bitline BLT0 with the write date input DATA_B applied to the gate of PFET 422.

SRAM local evaluation circuit 400 includes a plurality of read devices of a two-input NAND gate defined by a pair of PFETs 426, 428 connected to the voltage supply VDD and connected to a first of a pair of series connected NFETs 430, 432 with NFET connected to ground. PFETs 426, 428 and NFETs 430, 432 include a respective gate input coupled to the respective true bitlines BLT0, BLT1, as shown. An NFET 434 connected between the global dot line DOT and ground, with the output of NAND gate applied to the gate of NFET 434 driving the global dot line DOT.

It should be understood that the present invention is not limited to the illustrated SRAM local evaluation circuit 400 with a bit decode of 1. For example, if a bit decode of 2 or higher is required, then additional PCHGWRT signals would be added to a SRAM local evaluation circuit in accordance with the present invention.

Figure 5:
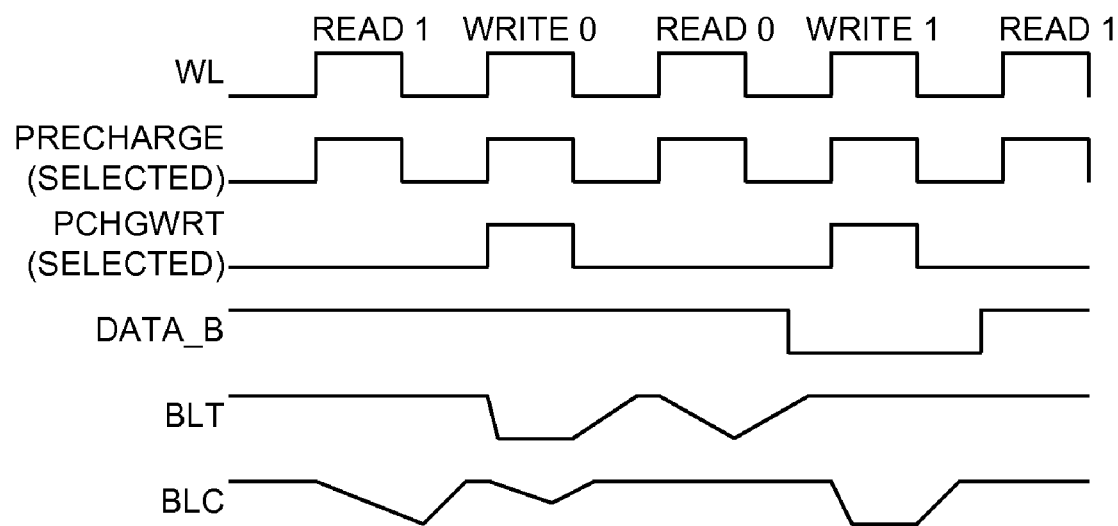
FIGS. 5, and 6 are timing diagrams illustrating the operation of the SRAM local evaluation circuit of FIG. 4 in accordance with the preferred embodiment.

Referring to FIG. 5, the operation of the SRAM local evaluation circuit 400 in accordance with the preferred embodiment is now described. First an operation READ 1 is shown, with DATA_B held high. The cell state prior to operation is TRU='1' and CMP='0'. The precharge PCHG1 and wordline input WL transition high disabling the precharge devices and activating the cell passgates. Since the TRU node is high, the BLT1 node stays at its precharge state thus a '1' is read. Note that during this operation PCHG1WRT stays low disabling the passgate NFET 408 between DATA_B and BLC. As a result, the weak clamp issue does not exist with this local evaluation circuit 400.

Then an operation WRITE 0 is shown, with DATA_B held high. The precharge signals PCHG1, PCHG1WRT, and the wordline input WL transition high. This disables the precharge devices PFET 402, 410, activates the pulldown stack on BLT1 while holding BLC1 at VDD-VT$_N$, and opens the passgates on the cell to allow the state on the bitlines BLC1 and BLT1 to be written to the cell.

Then an operation READ 0 is shown, with DATA_B held high. Cell state prior to operation is TRU='0'/CMP='1'. Inputs PCHG1 and WL transition high disabling the precharge devices and activating the cell passgates. Since the TRU node is low the BLT1 node discharges thus a '0' is propagated to the global dot line output DOT.

Then an operation WRITE 1 is shown, DATA_B transitions low before precharge signals PCHG1, PCHG1WRT, and the wordline input WL transition high. This disables the precharge devices 402, 410, enables the passgate 404 between DATA_B and BLC so that the '0' on DATA_B propagates to BLC, and opens the passgates on the cell to allow the state on the bitlines BLC1 and BLT1 to be written to the cell.

Note that the lower precharge PCHG0 and PCHG0WRT are held low while operations occur on BLT1 and BLC1 as illustrated and described above with respect to FIG. 5.

Figure 6:
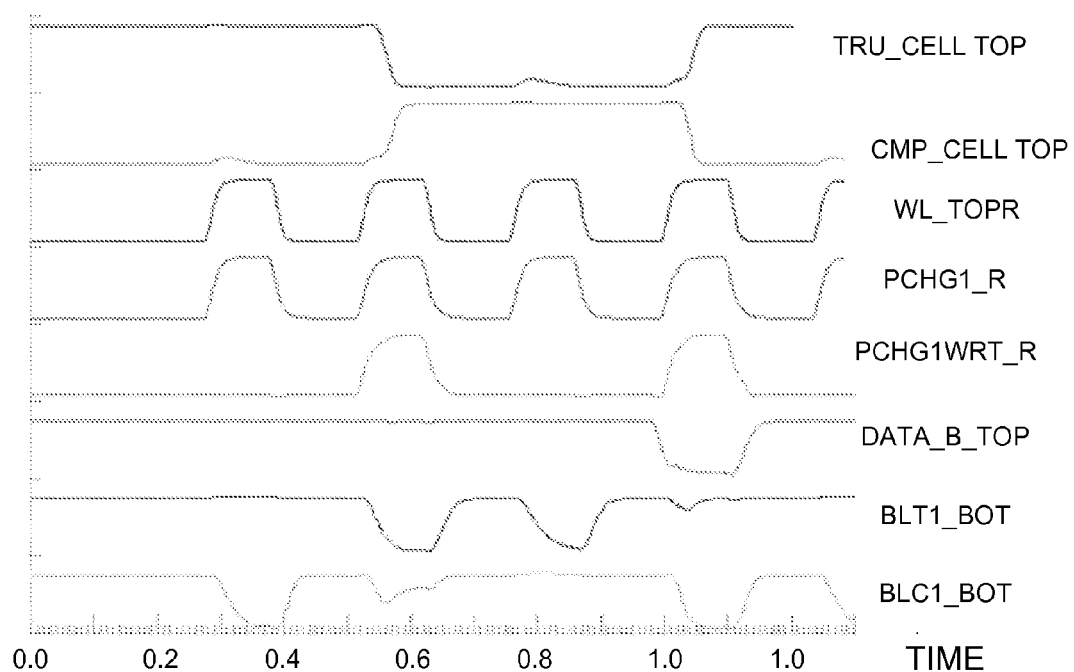

FIG. 6 provides simulation results for the SRAM local evaluation circuit 400 based upon stimulus described above with the nodes TRU and CMP of the associated cell shown at the top two waveforms. Notice that the nodes TRU, CMP, BLT1, and BLC1 all behave as expected.

Figure 7:
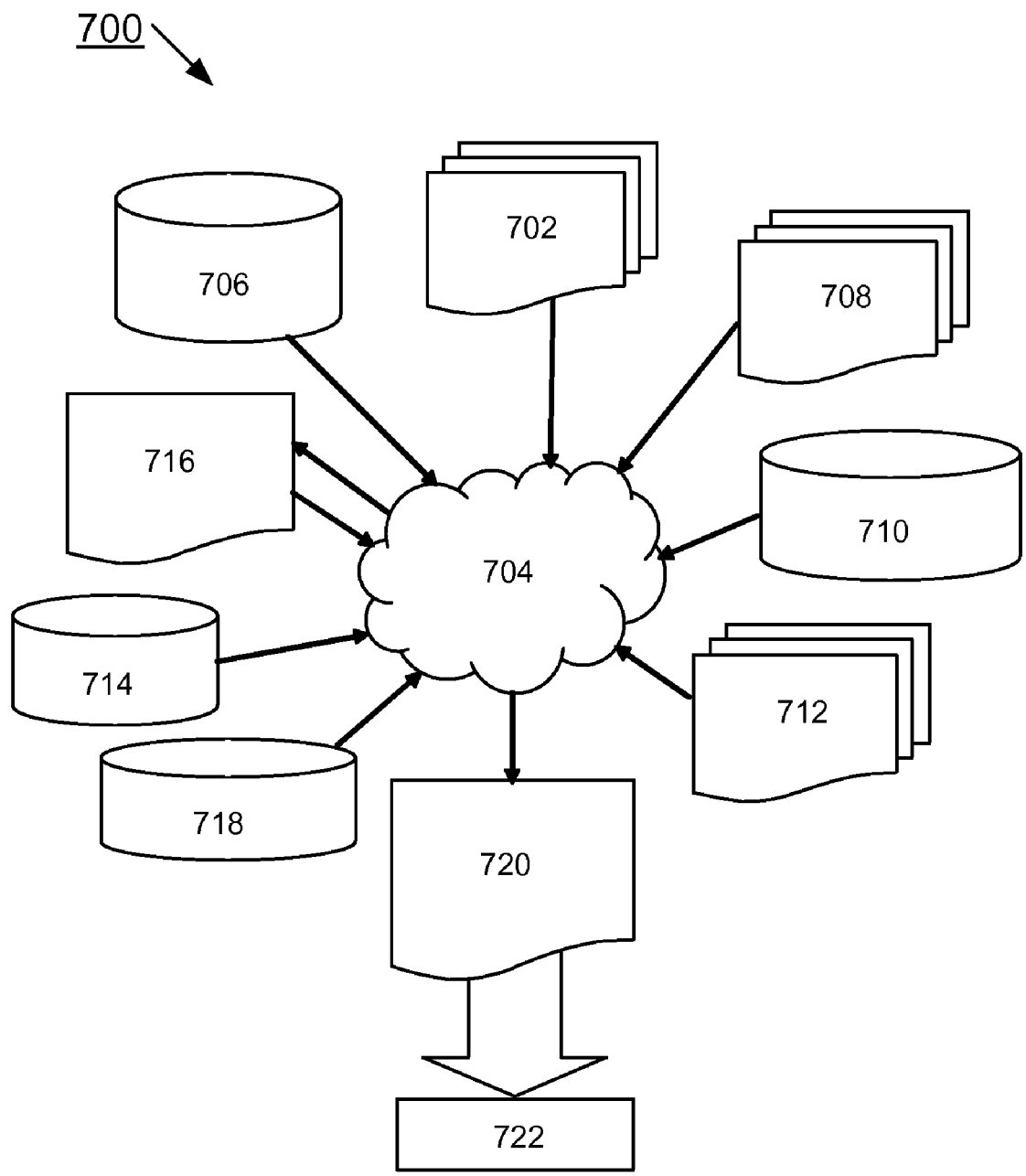
FIG. 7 is a flow diagram of a design process used in semiconductor design, manufacturing, and/or test.

FIG. 7 shows a block diagram of an example design flow 700. Design flow 700 may vary depending on the type of IC being designed. For example, a design flow 700 for building an application specific IC (ASIC) may differ from a design flow 700 for designing a standard component. Design structure 702 is preferably an input to a design process 704 and may come from an IP provider, a core developer, or other design company or may be generated by the operator of the design flow, or from other sources. Design structure 702 comprises circuit 400 in the form of schematics or HDL, a hardware-description language, for example, Verilog, VHDL, C, and the like. Design structure 702 is tangibly contained on, for example, one or more machine readable medium. For example, design structure 702 may be a text file or a graphical representation of circuit 400. Design process 704 preferably synthesizes, or translates, circuit 400 into a netlist 706, where netlist 706 is, for example, a list of wires, transistors, logic gates, control circuits, I/O, models, etc. that describes the connections to other elements and circuits in an integrated circuit design and recorded on at least one of machine readable medium. This may be an iterative process in which netlist 706 is resynthesized one or more times depending on design specifications and parameters for the circuit.

Design process 704 may include using a variety of inputs; for example, inputs from library elements 708 which may house a set of commonly used elements, circuits, and devices, including models, layouts, and symbolic representations, for a given manufacturing technology, such as different technology nodes, 32 nm, 45 nm, 90 nm, and the like, design specifications 710, characterization data 712, verification data 714, design rules 716, and test data files 718, which may include test patterns and other testing information. Design process 704 may further include, for example, standard circuit design processes such as timing analysis, verification, design rule checking, place and route operations, and the like. One of ordinary skill in the art of integrated circuit design can appreciate the extent of possible electronic design automation tools and applications used in design process 704 without deviating from the scope and spirit of the invention. The design structure of the invention is not limited to any specific design flow.

Design process 704 preferably translates an embodiment of the invention as shown in FIG. 4 along with any additional integrated circuit design or data (if applicable), into a second design structure 720. Design structure 720 resides on a storage medium in a data format used for the exchange of layout data of integrated circuits, for example, information stored in a GDSII (GDS2), GL1, OASIS, or any other suitable format for storing such design structures. Design structure 720 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIG. 4. Design structure 720 may then proceed to a stage 722 where, for example, design structure 720 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A static random access memory (SRAM) local evaluation circuit enabling read and write operations of an associated SRAM cell group comprising:
   a precharge write signal;
   a first precharge device being connected between a voltage supply VDD and a true bitline;
   a second precharge device being connected between the voltage supply VDD and a complement bitline; a precharge signal disabling said first and second precharge devices during read and write operations;
   a passgate device being connected between the complement bitline and a write data propagation input; said write data propagation input being held high during read operations and a write zero operation, and said write data propagation input transitioning low before a write one operation;

a transistor stack connected in series with said first precharge device between said true bitline and a ground potential; said transistor stack receiving said precharge write signal and said write data propagation input; and said precharge write signal disabling said passgate device connected between the complement bitline and said write data propagation input during read operations; said precharge write signal enabling the passgate device connected between the complement bitline and the write data propagation input during the write zero operation, and said precharge write signal activating said transistor stack during the write one operation.

2. The SRAM local evaluation circuit as recited in claim 1 wherein said precharge write signal eliminates a weak clamp condition of the associated SRAM cell group during a read one operation.

3. The SRAM local evaluation circuit as recited in claim 1 wherein said write data propagation input requires a single data wire.

4. The SRAM local evaluation circuit as recited in claim 1 wherein the SRAM local evaluation circuit provides an output connected to a global dot line.

5. The SRAM local evaluation circuit as recited in claim 4 includes a NAND gate coupled to said true bitline; an output of said NAND gate applied to a gate of a field effect transistor driving the global dot line.

6. A method for implementing a static random access memory (SRAM) local evaluation circuit enabling read and write operations of an associated SRAM cell group, said SRAM local evaluation circuit including a first precharge device being connected between a voltage supply VDD and a true bitline; a second precharge device being connected between the voltage supply VDD and a complement bitline; a precharge signal disabling said first and second precharge devices during read and write operations; said method comprising:

providing a precharge write signal;

providing a write data propagation input; said write data propagation input being held high during read operations and a write zero operation, and said write data propagation input transitioning low before a write one operation;

connecting a passgate device between the complement bitline and said write data propagation input;

connecting a transistor stack in series with said first precharge device between said true bitline and a ground potential; said transistor stack receiving said precharge write signal and said write data propagation input; and said precharge write signal disabling said passgate device connected between the complement bitline and said write data propagation input during read operations; said precharge write signal enabling the passgate device connected between the complement bitline and the write data propagation input during the write zero operation, and said precharge write signal activating said transistor stack during the write one operation.

7. The method for implementing the SRAM local evaluation circuit as recited in claim 6 includes eliminating a weak clamp condition of the associated SRAM cell group during a read one operation by said precharge write signal.

8. The method for implementing the SRAM local evaluation circuit as recited in claim 6 includes providing a single data wire for said write data propagation input.

9. The method for implementing the SRAM local evaluation circuit as recited in claim 6 includes applying an output of the SRAM local evaluation circuit to a global dot line.

10. The method for implementing the SRAM local evaluation circuit as recited in claim 6 includes providing a NAND gate coupled to said true bitline; and applying an output of said NAND gate to a gate of a field effect transistor driving the global dot line.

11. A design structure tangibly embodied in a machine readable medium used in a design process, the design structure comprising:

a static random access memory (SRAM) local evaluation circuit enabling read and write operations of an associated SRAM cell group including a precharge write signal;

a first precharge device being connected between a voltage supply VDD and a true bitline;

a second precharge device being connected between the voltage supply VDD and a complement bitline; a precharge signal disabling said first and second precharge devices during read and write operations;

a passgate device being connected between the complement bitline and a write data propagation input; said write data propagation input being held high during read operations and a write zero operation, and said write data propagation input transitioning low before a write one operation;

a transistor stack connected in series with said first precharge device between said true bitline and a ground potential; said transistor stack receiving said precharge write signal and said write data propagation input; and said precharge write signal disabling said passgate device connected between the complement bitline and said write data propagation input during read operations; said precharge write signal enabling the passgate device connected between the complement bitline and the write data propagation input during the write zero operation, and said precharge write signal activating said transistor stack during the write one operation, wherein the design structure, when read and used in the manufacture of a semiconductor chip produces a chip comprising the SRAM local evaluation circuit.

12. The design structure of claim 11, wherein the design structure comprises a netlist, which describes the SRAM local evaluation circuit.

13. The design structure of claim 11, wherein the design structure resides on storage medium as a data format used for the exchange of layout data of integrated circuits.

14. The design structure of claim 11, wherein the design structure includes at least one of test data files, characterization data, verification data, or design specifications.

15. The design structure of claim 11, wherein said precharge write signal eliminates a weak clamp condition of the associated SRAM cell group during a read one operation.

16. The design structure of claim 11, wherein said write data propagation input requires a single data wire.

17. The design structure of claim 11, wherein the SRAM local evaluation circuit provides an output connected to a global dot line.

18. The design structure of claim 17, wherein the SRAM local evaluation circuit includes a NAND gate coupled to said true bitline; an output of said NAND gate applied to a gate of a field effect transistor driving the global dot line.

* * * * *